(12) United States Patent
Lerner et al.

(10) Patent No.: US 11,414,740 B2
(45) Date of Patent: Aug. 16, 2022

(54) PROCESSING SYSTEM FOR FORMING LAYERS

(71) Applicant: Applied Materials, Inc., Santa Clara, CA (US)

(72) Inventors: Alexander N. Lerner, San Jose, CA (US); Roey Shaviv, Palo Alto, CA (US); Michael P. Karazim, San Jose, CA (US); Kevin Vincent Moraes, Mountain View, CA (US); Steven V. Sansoni, Livermore, CA (US); Andrew J. Constant, Cupertino, CA (US); Jeffrey Allen Brodine, Los Gatos, CA (US); Kim Ramkumar Vellore, San Jose, CA (US); Amikam Sade, Cupertino, CA (US); Niranjan Kumar, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/864,949

(22) Filed: May 1, 2020

(65) Prior Publication Data

US 2020/0385851 A1    Dec. 10, 2020

Related U.S. Application Data

(60) Provisional application No. 62/859,316, filed on Jun. 10, 2019.

(51) Int. Cl.
*C23C 14/04* (2006.01)
*C23C 14/02* (2006.01)
(Continued)

(52) U.S. Cl.
CPC .......... *C23C 14/042* (2013.01); *C23C 14/021* (2013.01); *C23C 14/08* (2013.01);
(Continued)

(58) Field of Classification Search
CPC .. C23C 14/042; C23C 14/566; H01L 51/0011
See application file for complete search history.

(56) References Cited

U.S. PATENT DOCUMENTS 7,148,502 B2 * 12/2006 Yamazaki ........... H01L 51/5016
257/40
7,432,195 B2    10/2008 Suzuki
(Continued)

FOREIGN PATENT DOCUMENTS

CN       1490169 A     4/2004
CN    101512720 A     8/2009
(Continued)

OTHER PUBLICATIONS

International Search Report and Written Opinion dated Aug. 7, 2020 for Application No. PCT/US2020/030744.

*Primary Examiner* — Jaehwan Oh
(74) *Attorney, Agent, or Firm* — Patterson + Sheridan, LLP (57) ABSTRACT

Embodiments of the present disclosure generally relate to a processing system for forming one or more layers of a photodiode. In one embodiment, the processing system includes a transfer chamber, a plurality of processing chambers, and a controller configured to cause a process to be performed in the processing system. The process includes performing a pre-clean process on a substrate, aligning and placing a first mask on the substrate, depositing a first layer on the substrate, and depositing a second layer on the substrate. The processing system can form layers of a photodiode in a low defect, cost effective, and high utilization manner.

22 Claims, 7 Drawing Sheets

(51) Int. Cl.
  *C23C 14/08* (2006.01)
  *H01L 51/00* (2006.01)
  *C23C 14/12* (2006.01)
  *H01L 51/44* (2006.01)

(52) U.S. Cl.
  CPC .......... *C23C 14/12* (2013.01); *H01L 51/0011* (2013.01); *H01L 51/448* (2013.01)

(56) References Cited

U.S. PATENT DOCUMENTS

| | | | |
|---|---|---|---|
| 7,459,396 | B2 | 12/2008 | Suzuki et al. |
| 7,638,002 | B2 | 12/2009 | Suzuki et al. |
| 7,708,835 | B2 | 5/2010 | Suzuki et al. |
| 7,776,740 | B2 | 8/2010 | Suzuki et al. |
| 7,829,454 | B2 | 11/2010 | Suzuki |
| 7,834,538 | B2 | 11/2010 | Yamazaki et al. |
| 7,846,256 | B2 | 12/2010 | Suzuki |
| 8,054,450 | B2 | 11/2011 | Peckerar et al. |
| 8,268,078 | B2 | 9/2012 | Suzuki et al. |
| 8,435,351 | B2 | 5/2013 | Vukovic |
| 8,796,067 | B2 | 8/2014 | Rolin et al. |
| 8,891,152 | B2 | 11/2014 | Fike, III et al. |
| 8,912,712 | B2 | 12/2014 | Yamazaki et al. |
| 9,176,318 | B2 | 11/2015 | Hagood et al. |
| 9,229,222 | B2 | 1/2016 | Hagood et al. |
| 9,274,333 | B2 | 3/2016 | Hagood, IV et al. |
| 9,450,135 | B2 | 9/2016 | Kwak et al. |
| 9,905,723 | B2 | 2/2018 | Kwak et al. |
| 2003/0221620 | A1* | 12/2003 | Yamazaki ............ C23C 14/246 118/724 |
| 2004/0040504 | A1* | 3/2004 | Yamazaki ......... H01L 21/67236 156/345.32 |
| 2004/0113289 | A1 | 6/2004 | Toda et al. |
| 2006/0037539 | A1 | 2/2006 | Toda et al. |
| 2006/0185597 | A1 | 8/2006 | Suzuki et al. |
| 2007/0218200 | A1 | 9/2007 | Suzuki et al. |
| 2007/0248515 | A1 | 10/2007 | Tompa et al. |
| 2008/0193645 | A1 | 8/2008 | Toda et al. |
| 2009/0170227 | A1* | 7/2009 | Yamazaki ........... G03F 7/70741 438/26 |
| 2010/0081274 | A1 | 4/2010 | Ishizaka et al. |
| 2010/0267191 | A1 | 10/2010 | Kwak et al. |
| 2012/0237682 | A1* | 9/2012 | Hong .................... C23C 14/042 118/712 |
| 2014/0116338 | A1 | 5/2014 | He et al. |
| 2014/0367250 | A1 | 12/2014 | Hachtmann et al. |
| 2015/0284841 | A1 | 10/2015 | Keller et al. |
| 2016/0011499 | A1* | 1/2016 | Hassan ................... G06F 16/25 430/5 |
| 2017/0022598 | A1 | 1/2017 | Schuler et al. |
| 2018/0130975 | A1* | 5/2018 | Law ..................... C09D 183/04 |
| 2018/0155834 | A1* | 6/2018 | Srinivasan ........ C23C 16/45534 |
| 2018/0301333 | A1* | 10/2018 | Li ..................... H01L 21/02167 |
| 2019/0071772 | A1 | 3/2019 | Keller et al. |
| 2019/0085454 | A1 | 3/2019 | Tompa et al. |
| 2019/0144988 | A1 | 5/2019 | Mizumura |
| 2020/0350160 | A1* | 11/2020 | Zhou ................... H01L 21/0217 |

FOREIGN PATENT DOCUMENTS

| | | |
|---|---|---|
| CN | 102460129 A | 5/2012 |
| CN | 102482760 A | 5/2012 |
| CN | 102056679 B | 1/2015 |
| CN | 103282540 B | 2/2015 |
| CN | 107435139 A | 12/2017 |
| CN | 107686975 A | 2/2018 |
| CN | 109554662 A | 4/2019 |
| EP | 470541 B1 | 10/1995 |
| JP | 2004-342455 | 12/2004 |
| JP | 2009076227 A | 4/2009 |
| JP | 2011192946 A | 9/2011 |
| JP | 4809288 B2 | 11/2011 |
| JP | 2012104393 A | 5/2012 |
| JP | 2013209700 A | 10/2013 |
| JP | 2013209710 A | 10/2013 |
| JP | 2013211139 A | 10/2013 |
| JP | 5570939 B2 | 8/2014 |
| JP | 2017057485 A | 3/2017 |
| JP | 2018003142 A | 1/2018 |
| JP | 2018003151 A | 1/2018 |
| JP | 6393802 B1 | 9/2018 |
| JP | 6448067 B2 | 1/2019 |
| JP | 6461235 B2 | 1/2019 |
| JP | 6468540 B2 | 2/2019 |
| JP | 2019039072 A | 3/2019 |
| JP | 2019083311 A | 5/2019 |
| KR | 20050046797 A | 5/2005 |
| KR | 100544561 B1 | 1/2006 |
| KR | 100669062 B1 | 1/2007 |
| KR | 100682153 B1 | 2/2007 |
| KR | 20070103465 A | 10/2007 |
| KR | 20080093705 A | 10/2008 |
| KR | 100900318 B1 | 6/2009 |
| KR | 20090117351 A | 11/2009 |
| KR | 100955371 B1 | 4/2010 |
| KR | 100998850 B1 | 12/2010 |
| KR | 10-2011-0035867 A | 4/2011 |
| KR | 20110058393 A | 6/2011 |
| KR | 20110059947 A | 6/2011 |
| KR | 101081694 B1 | 11/2011 |
| KR | 101087413 B1 | 11/2011 |
| KR | 20110133169 A | 12/2011 |
| KR | 101172931 B1 | 8/2012 |
| KR | 20130068926 A | 6/2013 |
| KR | 101322530 B1 | 10/2013 |
| KR | 101373782 B1 | 3/2014 |
| KR | 20140040297 A | 4/2014 |
| KR | 101412034 B1 | 6/2014 |
| KR | 20140067983 A | 6/2014 |
| KR | 101441478 B1 | 9/2014 |
| KR | 20150055822 A | 5/2015 |
| KR | 101563030 B1 | 10/2015 |
| KR | 20160084491 A | 7/2016 |
| KR | 101947796 B1 | 4/2019 |
| KR | 101979149 B1 | 5/2019 |
| WO | 2009149860 A2 | 12/2009 |
| WO | 2010101369 A2 | 9/2010 |
| WO | 2014112512 A1 | 7/2014 |
| WO | 2017222009 A1 | 12/2017 |

\* cited by examiner

PROCESSING SYSTEM FOR FORMING LAYERS

CROSS-REFERENCE TO RELATED APPLICATIONS

This Application claims priority to U.S. Provisional Application 62/859,316, filed on Jun. 10, 2019, which herein is incorporated by reference.

BACKGROUND

Field

Embodiments of the present disclosure generally relate to a processing system for forming one or more layers of a photodiode.

Description of the Related Art

Evaporation chambers are a tool for the production of layers of a photodiode, and the photodiode may be used in CMOS image sensor (CIS) or organic light emitting diode (OLED) applications. As an example, different organic material can be selectively deposited for different, respective pixels in a CIS utilizing an organic photoconductive film (OPF). Certain pixels (e.g., for sensing red light) can utilize a first organic material, while other pixels (e.g., for sensing green or blue light) can utilize a second, different organic material. In addition to the deposition of organic layers, other processes may be performed, such as pre-clean or deposition of inorganic layers, may be performed to form the photodiode.

Therefore, there is a need for an improved processing system that can perform various processes to form a photodiode.

SUMMARY

Embodiments of the present disclosure generally relate to a processing system for forming one or more layers of a photodiode. In one embodiment, a processing system includes a first transfer chamber, a plurality of processing chambers coupled to the first transfer chamber, and a controller configured to cause a process to be performed in the processing system. The process includes performing a pre-clean process on a substrate, aligning and placing a first mask on the substrate, and depositing a first layer on the substrate through the first mask. The depositing the first layer includes sublimating a first solid to a first gas and flowing the first gas through a first delivery portion of a showerhead assembly.

In another embodiment, a processing system includes a first transfer chamber, a first processing chamber coupled to the first transfer chamber, a second processing chamber coupled to the transfer chamber, one or more pass through chambers coupled to the first transfer chamber, a second transfer chamber coupled to the one or more pass through chambers, a third processing chamber coupled to the second transfer chamber, a fourth processing chamber coupled to the second transfer chamber, a fifth processing chamber coupled to the second transfer chamber, and a controller configured to cause a process to be performed in the processing system. The process includes performing a degas process on a substrate in the first processing chamber, performing a pre-clean process on the substrate in the second processing chamber, aligning and placing a first mask on the substrate in the third processing chamber, depositing a first layer on the substrate through the first mask in the fourth processing chamber.

In another embodiment, a method includes placing a substrate on a substrate carrier, performing a pre-clean process on a substrate in a processing system, aligning and placing a first mask on the substrate in the processing system, depositing a first layer on the substrate through the first mask in the processing system. The depositing the first layer includes sublimating a first solid to a first gas, flowing the first gas through a showerhead assembly maintained at a first temperature.

In another embodiment, a processing system includes a first transfer chamber, a plurality of processing chambers coupled to the first transfer chamber, and a controller configured to cause a process to be performed in the processing system. The process includes performing a pre-clean process on a substrate, aligning and placing a first mask on the substrate, and depositing a first layer on the substrate through the first mask. The depositing the first layer includes sublimating a first solid to a first gas, sublimating a second solid to a second gas, flowing the first gas through a first delivery portion of a showerhead assembly, and flowing the second gas through a second delivery portion of the showerhead assembly. The first delivery portion of the showerhead assembly is maintained at a first temperature and the second delivery portion of the showerhead assembly is maintained at a second temperature. The process further includes depositing a second layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to a processing system for forming one or more layers of a photodiode or an image sensor. In one embodiment, the processing system includes a transfer chamber, a plurality of processing chambers, and a controller configured to cause a process to be performed in the processing system. The process includes performing a pre-clean process on a substrate, aligning and placing a first mask on the substrate, depositing a first layer on the substrate, aligning and placing a second mask on the substrate, and depositing a second layer on the substrate. The processing system can form layers of a photodiode in a low defect, cost effective, and high utilization manner.

Figure 1:
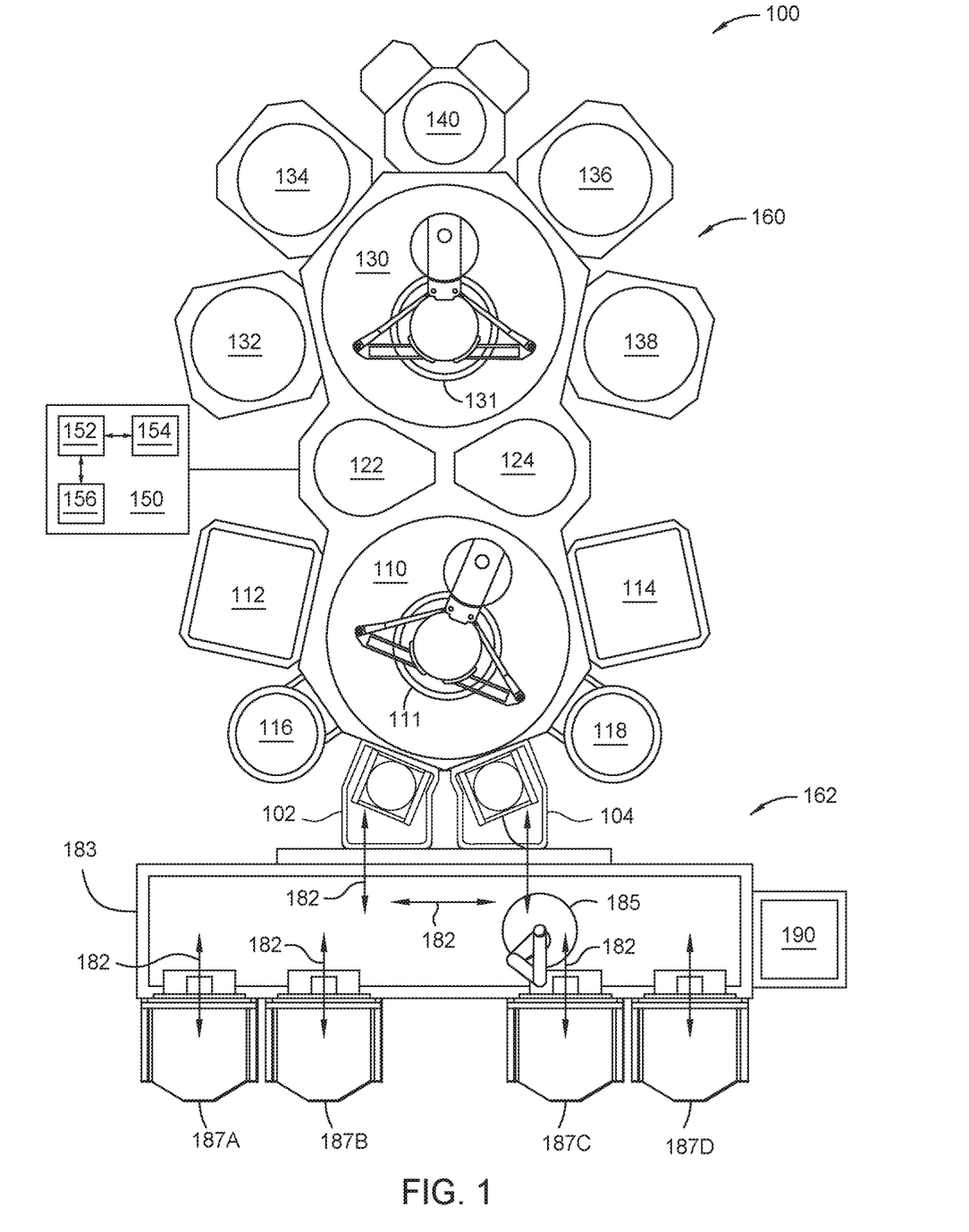
FIG. 1 is a schematic illustration of a processing system, according to one or more embodiments.

FIG. 1 illustrates a processing system 100 for processing a substrate, according to one or more embodiments. For example, the processing system 100 may deposit one or more metal oxide layers and/or organic materials on a substrate to fabricate a light sensing device. For example, the light sensing device may be an organic image sensing device. An example of a processing system includes the ENDURA® system, commercially available from Applied Materials, Inc. of Santa Clara, Calif. Alternatively, other substrate processing systems may be also be modified in accordance with the present disclosure.

The processing system 100 includes a vacuum-tight processing platform 160, a factory interface 162, and a controller 150. Further, the processing system 100 may also be referred to as a cluster tool or multi-chamber processing system.

The processing platform 160 includes one or more processing chambers. For example, the processing platform 160 may include processing chambers 112, 114, 116, 118, 132, 134, 138, 136, and 140. Further, the processing platform 160 includes one or more transfer chambers. For example, as is illustrated in FIG. 1, the processing platform 160 includes transfer chambers 110 and 130. The processing platform 160 may also include one or more pass through chambers that allow a substrate to be transferred between transfer chambers. For example, the pass through chambers 122, 124 may allow a substrate to be transferred between the transfer chambers 110 and 130.

The processing chambers 112, 114, 116, 118, 132, 135, 138, 136, and 140 include first processing chambers 112, 114, 116, 118, a second processing chamber 138, a third processing chambers 132, 134, 136, and a fourth processing chamber 140. The first processing chambers 112, 114, 116, 118 include the pre-clean and degas chambers. The second processing chamber 138 includes a substrate processing chamber configured to deposit one or more metal oxide layers. The third processing chambers 132, 134, 136 include substrate processing chambers configured to deposit one or more organic films on a substrate. The fourth processing chamber 140 includes a mask alignment chamber and is configured to position masks on substrates.

The processing platform 160 may also include one or more load lock chambers 102, 104. For example, as is illustrated in FIG. 1, the processing platform 160 includes two load lock chambers 102, 104. The load lock chambers 102, 104 are disposed between the factory interface 162 and the processing platform 160. The load lock chambers 102, 104 may be pumped down to be operated under a vacuum before transferring substrates from the factory interface 162 to the transfer chamber 110.

The factory interface 162 includes one or more docking stations 183, one or more factory interface robots 185, and a substrate carrier chamber 190. The docking stations 183 include one or more front opening unified pods (FOUPS) 187A-187D. The factory interface robot 185 may be capable of linear and rotational movement illustrated by arrows 182. Further, the factory interface robot 185 may transfer substrates between the FOUPS 187, the load lock chambers 102, 104 and the substrate carrier chamber 190. The substrate carrier chamber 190 may be configured to mount the substrate on a carrier (e.g., a chuck) or remove the substrate from the carrier. For example, a carrier may include one or more conductive elements (e.g., chucking electrodes) configured to electrostatically hold (e.g., "chuck") the substrate against the carrier. The carrier and "chucked" substrate may be transferred by the factory interface robot 185 from the substrate carrier chamber 190 to one or more of the load lock chambers 102, 104. Additionally, the carrier and a processed substrate may be transferred from the load lock chambers 102, 104 to the substrate carrier chamber 190 such that the processed substrate may be removed from the carrier, and the processed substrate may be transferred from the substrate carrier chamber 190 to one of the FOUPS 187 by the factory interface robot 185. One or more pre-aligners may be disposed in the factory interface 162 to align the substrate and the carrier. In one embodiment, a first pre-aligner is utilized to align the substrate by identifying the center of the substrate and a notch on the substrate for proper clocking. A second pre-aligner is utilized to align the carrier by identifying the center of the carrier and a notch on the carrier for proper clocking.

The transfer chamber 110 includes a transfer robot 111. The transfer robot 111 transfers substrates to and from the load lock chambers 102, 104, to and from the first processing chambers 112, 114, 116, and 118, and to and from pass through chambers 122, 124. The pass through chambers 122 and 124 maintain vacuum conditions while allowing substrates to be transferred within the processing system 100 between transfer chambers 110 and 130. The transfer robot 131 transfers substrates from the pass through chambers 122, 124 to the processing chambers 132, 134, 136, 138, and 140, and between the processing chambers 132, 134, 136, 138, and 140.

The processing chambers 112, 114, 116, 118, 132, 134, 136, 138, and 140 may be configured in any manner suitable to process a substrate. For example, the processing chambers 112, 114, 116, 118, 132, 134, 136, 138, and 140 may be configured to deposit one or more metal oxide layers, one or more organic films and apply one or more cleaning processes to a substrate to create a semiconductor device such as a photodiode, a light sensing device, or the like.

A first one or more of the processing chambers, e.g., the first processing chambers 112, 114, 116, 118 are configured to perform a pre-clean process to eliminate contaminants and/or degas volatile components from a substrate prior to transferring the substrate into another process chamber. The second processing chamber 138 is configured to deposit one or more metal oxide layers on a substrate. The one or more metal oxide layers may be fabricated from indium tin oxide (ITO), silicon oxide, silicon nitride, aluminum oxide, or any suitable material. The third processing chambers 132, 134, 136 are configured to deposit one or more organic films on a substrate. Further, the fourth processing chamber 140 is configured to position a mask (e.g., a shadow mask) on a substrate before the substrate is transferred to one or more the second and third processing chambers 132, 134, 136 and 138 and unload a mask from a substrate after processing within one or more of the second and third processing chambers 132, 134, 136, and 138. The second and third processing chambers 132, 134, 138, 136 may be configured to deposit materials (e.g., metal oxide layers or organic films) using a chemical deposition process such as chemical vapor deposition (CVD), atomic layer deposition (ALD), metalorganic chemical vapor deposition (MOCVD), plasma-enhanced chemical vapor deposition (PECVD), and physical vapor deposition (PVD) (e.g., sputtering process or evaporation process), among others.

The controller 150 is configured to control the components of the processing system 100. The controller 150 may be any suitable controller for controlling the operation of one or more of the processing chambers, the transfer chambers, pass through chambers, and the factory interface. For example, the controller 150 may be configured to control the operation of transfer robot 111 and/or the transfer robot 131. The controller 150 includes a central processing unit (CPU) 152, a memory 154, and support circuits 156. The CPU 152 may be any general purpose computer processor that may be utilized in an industrial environment. The support circuits 156 are coupled to the CPU 152 and may include cache, clock circuits, input/output subsystems, power supplies and the like. Software routines may be stored within the memory 154. The software routines may be executed by the CPU 152 and thus be adapted to cause various components within the processing system 100 to perform one or more of the methods described herein. Alternatively, or additionally, one or more of the software routines may be executed by a second CPU not illustrated. The second CPU may be part of the controller 150 or remote from the controller 150.

One or more processing chambers, one or more transfer chambers, one or more pass through chambers, and/or the factory interface may have a dedicated controller or controllers (not shown) configured to control at least a portion of the methods disclosed herein. The dedicated controllers may be configured similar to the controller 150 and may be coupled with the controller 150 to synchronize processing of a substrate within the processing system 100.

Figure 2:
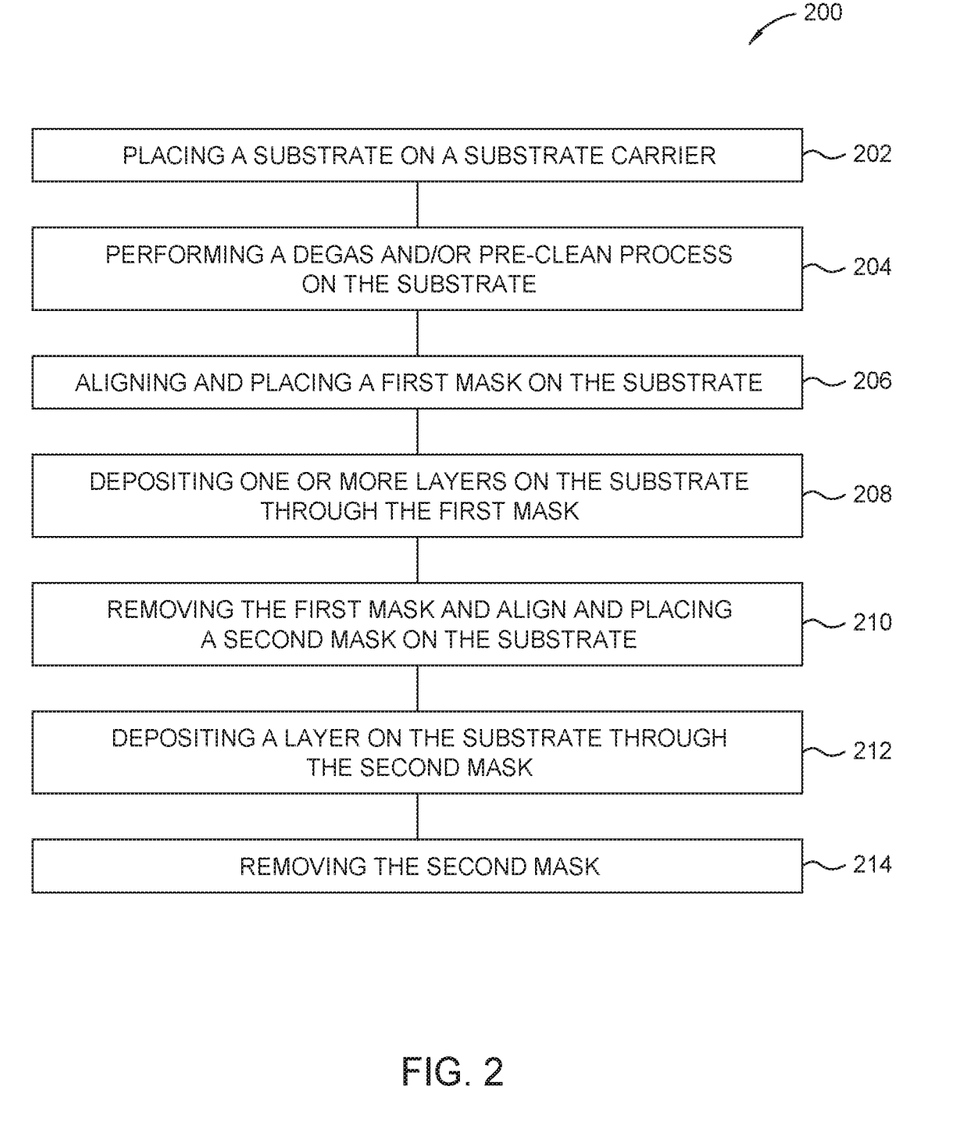
FIG. 2 illustrates a flow chart of a method for forming one or more layers of a photodiode, according to one or more embodiments.

FIG. 2 illustrates a flow chart of a method 200 for forming one or more layers of a photodiode, according to one or more embodiments. At operation 202, a substrate is aligned with and placed on a substrate carrier. The substrate carrier may be any suitable carrier that has one or more features that are used to align and position a substrate in a desired orientation and position on a surface of the carrier. In one embodiment, the substrate carrier is a portable electrostatic chuck (ESC) configured to hold the substrate using electrostatic forces. The electrostatic force used to hold the substrate by portable ESC may be maintained utilizing a battery stored on board the ESC, residual capacitance of interleaving electrodes of the ESC, or utilizing another technique. The portable ESC includes one or more electrodes embedded therein. After power is applied to the one or more electrodes to chuck the substrate to the substrate carrier, the electrostatic forces remain with the substrate carrier and the substrate even after power is no longer supplied to the one or more electrodes (i.e., during the transfer of the substrate and substrate carrier within a processing system, such as the processing system 100). As such, the substrate is advantageously prevented from moving during the transfer of the substrate carrier. The substrate may be placed on the substrate carrier in a chamber, such as the substrate carrier chamber 190 (shown in FIG. 1).

At operation 204, a degas and/or pre-clean processes are performed on the substrate in one or more processing chambers. The degas and/or pre-clean processes remove any volatile components and/or contaminants from the surface of the substrate and carrier. In one embodiment, the degas process is performed followed by the pre-clean process. The degas process and the pre-clean process may be performed in the same or in different processing chambers. In one embodiment, the degas process is performed in a degas processing chamber, such as the first processing chamber 116 or 118 (shown in FIG. 1), and the pre-clean process is performed in a pre-clean processing chamber, such as the first processing chamber 112 or 114 (shown in FIG. 1). The substrate may be carried by a substrate carrier and transferred from the substrate carrier chamber to the chamber for the degas and/or pre-clean processes. The substrate includes one or more layers previously formed thereon, and the degas and/or pre-clean processes remove any volatile components and/or contaminants from the surface of the topmost layer on the substrate. For example, the substrate includes a metal oxide layer, such as an ITO layer, as the topmost layer. The degas process includes heating the substrate to a predetermined temperature at a low pressure maintained by a vacuum pump. The volatile components are volatilized and are removed by the vacuum pump. In another example, a native oxide layer is formed on the surface of the substrate, and a pre-clean process is performed to selectively remove the native oxide layer. The pre-clean process may be any suitable pre-clean process.

At operation 206, a first mask is aligned and placed on or over a surface of the substrate. The first mask includes a first predetermined pattern of openings to allow material to be deposited on a surface of the substrate at positions corresponding to the openings. The first mask may be aligned and placed on or over the substrate in a mask alignment chamber, such as the fourth processing chamber 140 (shown in FIG. 1). The mask alignment chamber may include an alignment stage for aligning the first mask to the substrate and placing the first mask on the substrate. The mask alignment chamber may also include a mask stocker for stocking a plurality of masks. An example of the mask alignment chamber is described below in relation to FIGS. 3 and 4.

At operation 208, one or more layers are deposited on the substrate through the mask. The one or more layers may be one or more organic films, such as OPFs. In one embodiment, the one or more layers include a bilayer bulk heterojunction. In one embodiment, the bilayer bulk heterojunction includes tris (8-hydroxyquinolinato) aluminum ($Alq_3$) or buckminsterfullerene ($C_{60}$). The one or more layers have a pattern corresponding to the first predetermined pattern of openings of the first mask. The one or more layers may be deposited by any suitable method, such as CVD, PECVD, MOCVD, ALD, or PVD. The one or more layers may be deposited in a processing chamber, such as the third processing chambers 132, 134, or 136 (shown in FIG. 1). In one embodiment, the one or more layers are deposited by evaporation processes. For example, co-evaporation or co-sublimation (in the case of solid material(s)) of two or more process materials may be performed to generate the one or more layers on the substrate. In one embodiment, co-deposited heterojunctions includes a first green bulk heterojunction layer and a second green bulk heterojunction layer. An example of the evaporation chamber for forming the one or more layers is described in FIG. 5A. In some embodiments, a first layer is deposited in the processing chamber by evaporation of one material through the mask, and a second layer is deposited in the processing chamber by co-evaporation of two materials through the mask. In some embodiments, more than two materials, such as three or four materials, are co-evaporated to form a layer.

At operation 210, which is optional, the first mask is removed and a second mask is aligned and placed on or over a surface of the substrate. The second mask includes a second predetermined pattern of openings that is different from the first predetermined pattern of openings. The removal of the first mask and the alignment and placement of the second mask may be performed in the mask alignment chamber, such as the fourth processing chamber 140 (shown in FIG. 1). The mask alignment chamber is further described in FIGS. 3 and 4.

At operation 212, a layer is deposited on the substrate through the first mask, or the second mask if operation 210 is performed. The layer may be a metal oxide layer, such as an ITO layer. The layer has a second pattern different from the first pattern. The second pattern corresponds to the second predetermined pattern of openings of the second mask. The layer may be deposited by any suitable method, such as CVD, PECVD, MOCVD, ALD, or PVD. The layer may be deposited in a processing chamber, such as the second processing chamber 138 (shown in FIG. 1). In one embodiment, the layer is deposited by a PVD process. An example of a PVD chamber is described in FIG. 6. The processing chamber for depositing the layer is part of a processing system, such as the processing system 100. Thus, the substrate and the mask are transferred from the mask alignment chamber or a deposition chamber to the processing chamber under the same pressure i.e., no vacuum break, and there is no need to re-align the mask.

At operation 214, the first or second mask is removed. The first or second mask may be removed in the mask alignment chamber. Operations 206, 208, 210, 212, and 214 may be repeated to form a multi-layered structure.

Referring to FIGS. 1 and 2, the method 200 may be performed in the processing system 100 as follows. The substrate is transferred to the substrate carrier chamber 190 from one of the FOUPs 187, and the substrate is placed on the substrate carrier in the substrate carrier chamber 190, as shown at operation 202. The substrate carrier and the substrate are transferred to the degas processing chamber 116 or 118, and a degas process is performed on the substrate, as shown at operation 204. The substrate carrier and the substrate are then transferred to the pre-clean processing chamber 112 or 114, and a pre-clean process is performed on the substrate, as shown at operation 204. The substrate carrier and the substrate are then transferred to the fourth processing chamber 140, in which a first mask is aligned and placed on the substrate, as shown at operation 206. The substrate carrier and substrate with the first mask placed thereon are then transferred to one of the third processing chambers 132, 134 or 136, in which one or more layers are deposited on the substrate through the first mask, as shown at operation 208. The substrate carrier and the substrate with the first mask placed thereon are then optionally transferred to the fourth processing chamber 140, in which the first mask is removed and the second mask is aligned and placed on the substrate, as shown at operation 210. The substrate carrier and the substrate with the first or second mask placed thereon are then transferred to the processing chamber 138, in which a layer is deposited on the substrate through the first or second mask, as shown at operation 212. The substrate carrier and the substrate with the second mask placed thereon are then transferred to the fourth processing chamber 140, in which the first or second mask is removed. The substrate having at least two layers, e.g., an organic layer and a metal oxide layer, may be removed from the substrate carrier. In one embodiment, the substrate is removed from the substrate carrier in the factory interface 162 (shown in FIG. 1). All of the operations are performed within the processing system 100, so there is no vacuum break between operations, which reduces the chance of contamination.

Figure 3:
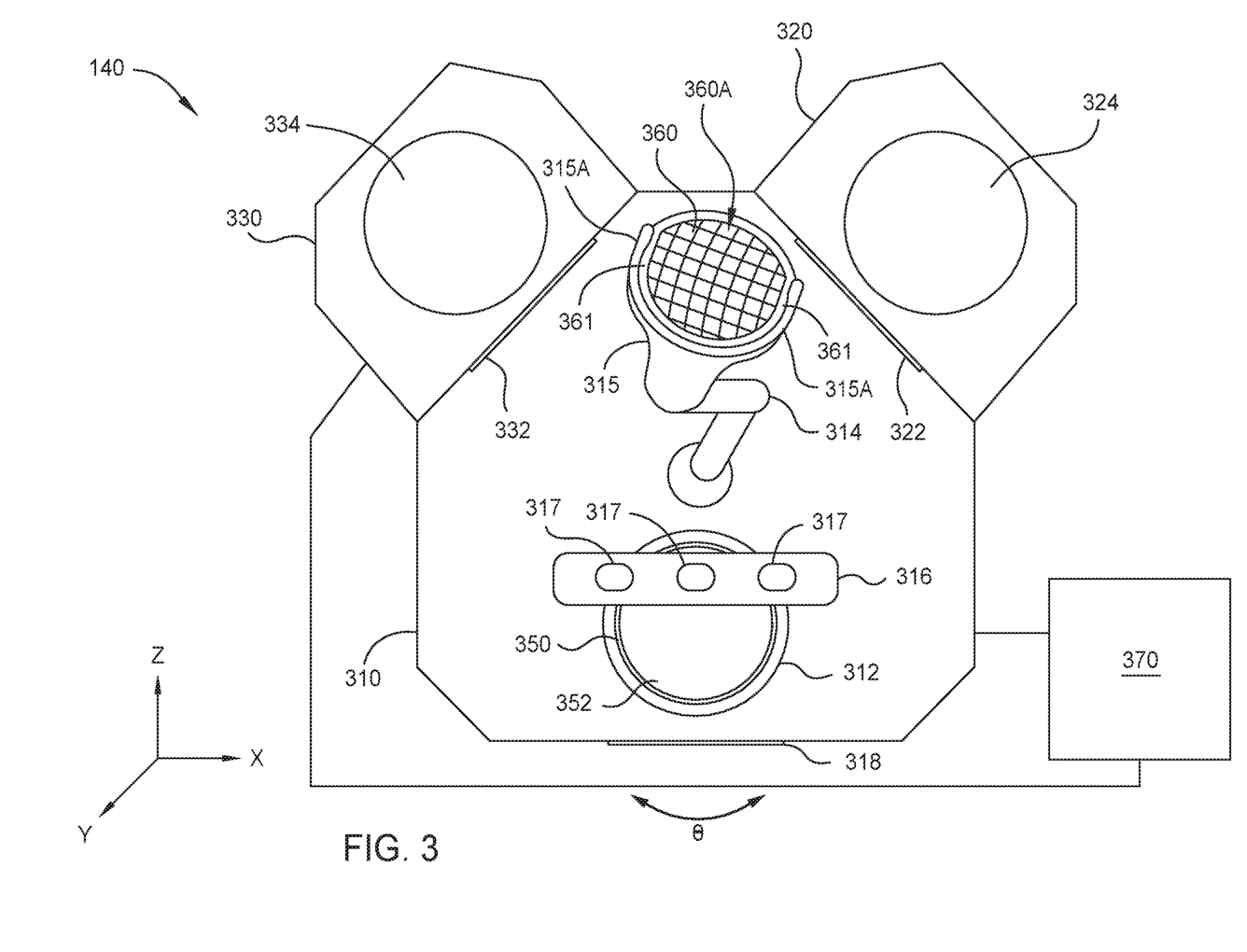
FIG. 3 is a schematic illustration of a processing chamber for aligning and placing a mask on a substrate, according to one or more embodiments.

FIG. 3 is a schematic illustration of the fourth processing chamber 140 for aligning and placing a mask on a substrate, according to one or more embodiments. The fourth processing chamber 140 is a mask alignment chamber. The fourth processing chamber 140 includes an alignment portion 310 and a mask stocker 320. Additionally, the fourth processing chamber 140 includes a second mask stocker, e.g., the mask stocker 330.

The alignment portion 310 includes alignment stage 312, transfer robot 314, alignment system 316, and valve assembly 318. The valve assembly 318 is configured to isolate the interior volume of the processing chamber 140 from a transfer chamber, e.g., the transfer chamber 130, of the integrated platform 160 (shown in FIG. 1). The valve assembly 318 includes a conventional slit valve or gate valve that is configured to isolate one region or volume from another by opening, closing or obstructing a port or passageway formed between the adjoining regions or volumes. Additionally, the valve assembly 318 may be configured to allow a carrier 350 carrying (or supporting) a substrate 352 to be transferred into and out of the alignment chamber 140.

The alignment stage 312 is configured to hold the carrier 350 and substrate 352 while a mask, e.g., mask 360, is aligned with and positioned over the substrate 352 or removed from the substrate 352. The alignment stage 312 may move in one or more of an X, Y, Z, and θ directions to position and align the substrate 352 with the mask 360.

The masks 360 have a plurality of openings 360A, each having a diameter in a range of about 3 μm to about 5 μm, or having a rectangular open area that has a width between about 3 μm and about 5 μm and a height between about 3 μm and about 5 μm. Alternatively, the mask 360 may have one or more openings that have a feature dimension (e.g., width, height, diameter) that is less than 3 μm or greater than 5 μm.

The alignment system 316 is configured to aid in the alignment of the mask 360 with the substrate 352 and/or carrier 350. The alignment system 316 includes one or more cameras 317 configured to capture images of the mask 360, the carrier 350 and/or the substrate 352. The cameras 317 are configured to acquire one or more images of the mask 360, carrier 350 and the substrate 352. The images are analyzed to determine a difference in alignment between the mask 360 and the substrate 352. Analyzing the images may include comparing the position of one or more alignment elements (e.g., fiducial markers) of the mask 360 with corresponding alignment elements (e.g., fiducial markers) of the substrate 352 or the carrier 350. The images may be provided to the controller 370 which determines the difference between the alignment elements on the mask 360 and the alignment elements of the substrate 352 or carrier 350. Further, the controller 370 determines the direction or directions and the amount to move the stage 312 supporting the substrate 352 and carrier 350 to align the substrate 352 with the mask 360 based on the analyzed images.

The transfer robot 314 is configured to transfer masks between the masks stockers 320, 330 and the alignment stage 312. The transfer robot 314 may be controlled by the controller 370. The transfer robot 314 is disposed between the alignment system and the first and second mask stockers 320, 330. The transfer robot 314 includes a blade 315 configured to support a mask, e.g., the mask 360, along parallel edges 361 of the mask. For example, the blade 315 may include two or more fingers 315A configured to grip along first and second parallel edges 361 of the mask 360. The first and second parallel edges 361 of the mask 360 may comprise portions that are substantially flat and parallel to each other. The two or more fingers 315A may extend symmetrically from the blade and form a semicircle. The two or more fingers 315A have parallel ends.

The transfer robot 314 may receive instructions from the controller 370 instructing the transfer robot 314 to access a first mask stocker, e.g., mask stocker 320, to acquire a first mask, e.g., the mask 360, and position the mask 360 over the surface of the substrate 352 and carrier 350. Further, the transfer robot 314 may receive instructions from the controller 370 to remove the mask 360 from a position over the substrate 352 and the carrier 350. The transfer robot 314 may also transfer masks between the mask stockers 320, 330.

Figure 4:
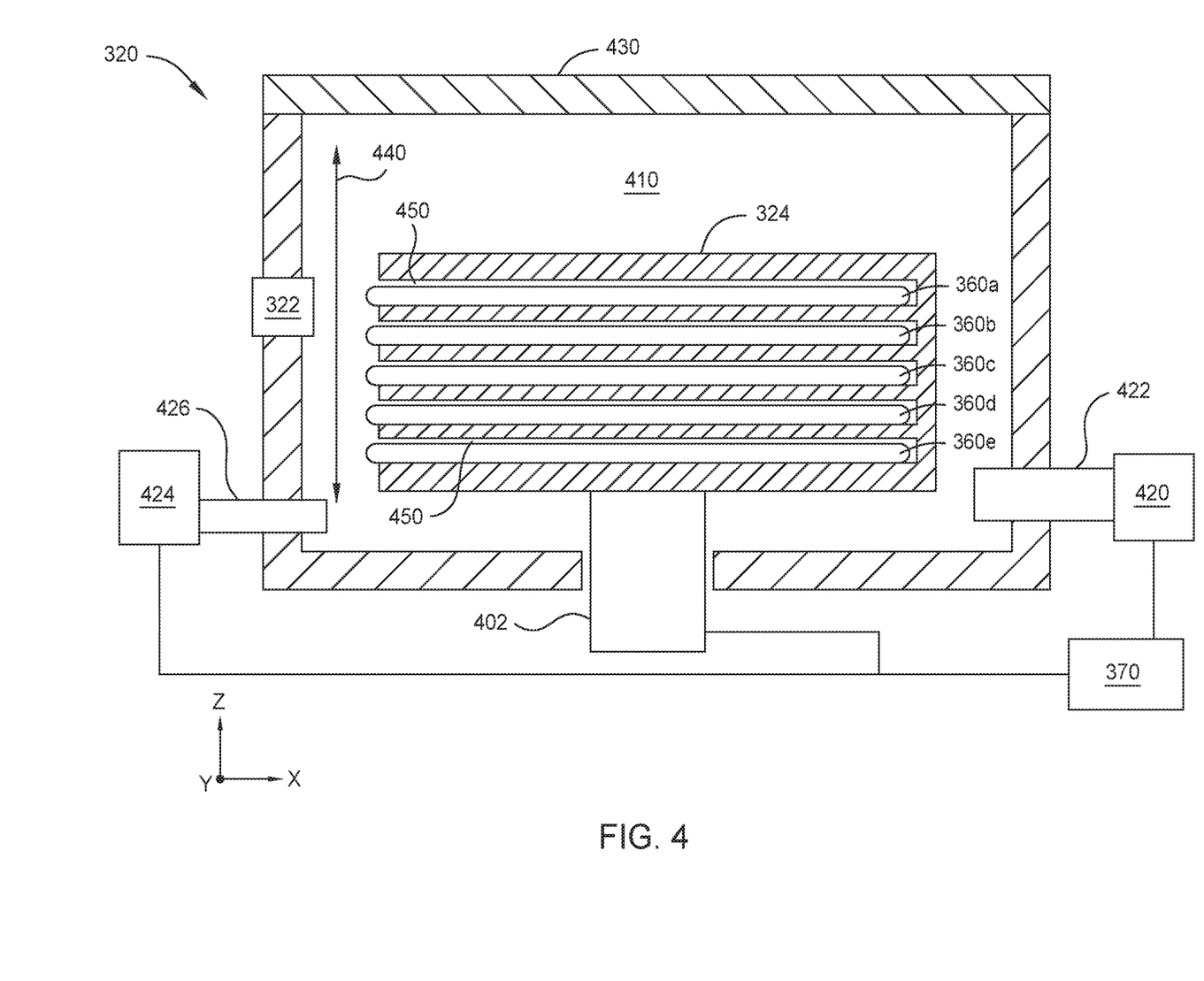
FIG. 4 is a schematic illustration of a mask stocker of the processing chamber of FIG. 3, according to one or more embodiments.

The mask stocker 320 includes a valve assembly 322, similar to the valve assembly 318, to isolate the interior volume of the mask stocker 320 from the interior volume of the alignment portion 310. Further, as shown in FIG. 4, the mask stocker 320 houses a mask cassette 324. A vertical actuator 402 is configured to move the mask cassette 324 in a vertical direction to align a selected mask with the valve assembly 322 such that it may be accessed by the transfer robot 314. Further, the vertical actuator 402 may move the mask cassette 324 in a vertical direction to align an empty slot of the mask cassette 324 with the valve assembly 322 such that a mask may be transferred to the mask cassette 324 by the transfer robot 314. The mask stocker 320 is attached to a wall of the alignment portion 310 of the fourth processing chamber 140. The mask stocker 320 is disposed on the opposite end of the alignment portion 310 from the valve assembly 318 and the connection to the transfer chamber 130.

The mask stocker 330 may be configured similarly to that of mask stocker 320. For example, the mask stocker 330 includes a valve assembly 332, a mask cassette 334 and a vertical actuator (not shown), each configured similarly to that of the valve assembly 322, the mask cassette 324 and the vertical actuator 402, respectively. The mask stocker 330 is also attached to a wall of the alignment portion 310 of the fourth processing chamber 140. The mask stocker 330 is disposed on the opposite end of the alignment portion 310 from the valve assembly 318 and the connection to the transfer chamber 130. The mask stocker 320 and the mask stocker 330 are disposed adjacent to one another. The transfer robot 314 is disposed between both of the mask stockers 320, 330.

Both of the mask stockers 320 and 330 may house one or more masks which may be used during a deposition process. Further, the mask stocker 320 may house masks of a first type and the mask stocker 330 may house masks of a second type. For example, the mask stocker 320 may house masks utilized during the deposition of organic materials and the mask stocker 330 may house masks utilized during the deposition of metal oxide layers. Further, the mask stocker 320 may be controlled independently from the mask stocker 330.

Alternatively, the mask stocker 320 may house one or more masks which may be used during a deposition process, and the mask stocker 330 may house one or more masks to be cleaned. For example, the transfer robot 314 may move masks that have been identified as being ready to be cleaned from the mask stocker 320 to the mask stocker 330 or from the alignment stage 312 to the mask stocker 330.

FIG. 4 illustrates a cross-sectional view of the mask stocker 320, according to one or more embodiments. The mask stocker 320 includes an interior volume 410 in which the mask cassette 324 may be positioned. The mask cassette 324 is coupled to vertical actuator 402, and the vertical actuator 402 is configured to move the mask cassette 324 along path 440 to align a selected one of the masks 360a-360e or slots 450 with the valve assembly 322. As illustrated in FIG. 4, the mask cassette 324 may be configured to hold 5 masks, e.g., the masks 360a-360e. Alternatively, the mask cassette 324 may be configured to hold less than 5 masks or more than 5 masks. The mask stocker 320 may also include a lid 430, which may be opened to gain access to the interior volume 410. The mask stocker 320 may also include a gas supply source 424 that is configured to provide one or more gases to the interior volume 410 via a gas inlet 426, which is fluidly connected to both the gas supply source 424 and the interior volume 410. The gas supply source 424 may be configured to pump one or more gases into the interior volume 410 to increase the pressure of the interior volume. Additionally, the mask stocker 320 may include a vacuum pump 420 and a gas outlet 422. The vacuum pump 420 may be configured to remove gas from the interior volume 410 to reduce the pressure of the interior volume 410. The gas outlet 422 fluidly connects the vacuum pump 420 and the interior volume 410. For example, the vacuum pump 420 may exhaust one or more gases from the interior volume 410 to place the interior volume 410 at or near vacuum. The vacuum pump 420 is disposed on a wall opposite the gas supply source 424.

The controller 370 may be electrically coupled to the vertical actuator 402, the gas supply source 424 and the vacuum pump 420. Further, the controller 370 may control the vertical actuator 402 to move the mask cassette 324 along the path 440, the gas supply source 424 to input a gas into the interior volume 410, and/or the vacuum pump 420 to remove gas from the interior volume 410. Additionally, the controller 370 may be configured similar to that of the controller 150 or form part of the controller 150.

Figure 5A:
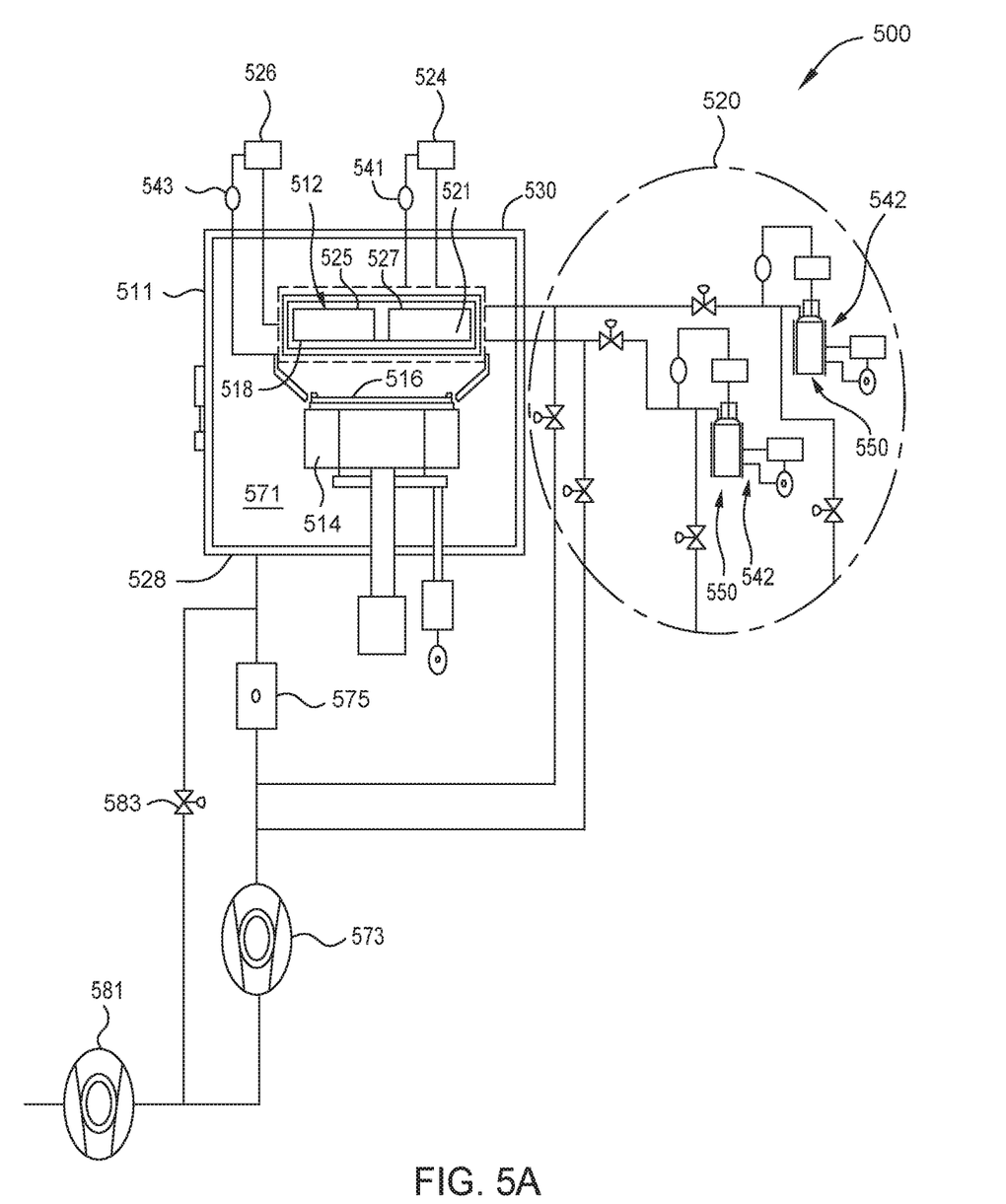
FIG. 5A is a schematic illustration of a processing chamber for depositing one or more layers, according to one or more embodiments.

FIG. 5A is a schematic illustration of a processing chamber 500 for depositing one or more layers, according to one or more embodiments. The processing chamber 500 may be any one of the third processing chambers 132, 134, and 136 shown in FIG. 1. The processing chamber 500 may be an evaporation chamber for depositing one or more organic films, such as OPFs. The processing chamber 500 includes a bottom 528, a sidewall 511, a lid 530, and a processing region 571 defined by the bottom 528, the sidewall 511, and the lid 530. A substrate support 514 for supporting a substrate 516 is disposed in the processing region 571. A showerhead assembly 512 is disposed over the substrate support 514. The showerhead assembly 512 includes a first delivery portion 518 and a second delivery portion 521. The first and second delivery portions 518, 521 are separate portions of the showerhead assembly 512. The first and second delivery portions 518, 521 are fluidly isolated from each other, such that each of the first and the second delivery portions 518, 521 deliver gasses independent from the gasses supplied by the other of the first and the second deliver portions 518, 521. The processing chamber 500 further includes a first heating assembly 525 to heat the first delivery portion 518 and a second heating assembly 527 to separately heat the second delivery portion 521. A first temperature sensor 541 and a first temperature controller 524 are coupled to the first gas delivery portion 518. The first temperature controller 524 is configured to receive input from the first temperature sensor 541 to control, adjust, or set a temperature of the first heating assembly 525. A second temperature sensor 543 and a second temperature controller 526 are coupled to the second gas delivery portion 521. The second temperature controller 526 is configured to receive input from the second temperature sensor 543 to control, adjust, or set a temperature of the second heating assembly 527. The showerhead assembly 512 may include more than two delivery portions, such as four delivery portions, and each delivery portion may be heated by a corresponding heating assembly. Furthermore, each delivery portion may be coupled to a corresponding temperature sensor and temperature controller. Thus, the number of heating assemblies, temperature sensors, and temperature controllers may depend on the number of delivery portions.

The processing chamber 500 further includes a material delivery system 520. The material delivery system 520 may include one or more ampules 550 in fluid communication with the showerhead assembly 512. In some embodiments, there is at least one ampule per delivery portion of the showerhead assembly 512. The one or more ampules 550 contain one or more materials, such as tris (8-hydoxyquinolinato) aluminum ($Alq_3$) fullerene ($C_{70}$), or buckminsterfullerene ($C_{60}$). The one or more ampules 550 are heated by a heating system 542. In some embodiments, the lines between the ampules 550 and the showerhead assembly 512 are heated by heating jackets or other heating systems. The material delivery system 520 delivers a first material to the first delivery portion 518 at a first temperature and delivering a second material to the second delivery portion 521 at a second temperature. The materials may initially be solids in the ampules 550 and then sublimated to gases when flown from the ampules 550 to the showerhead assembly 512 and heated by the heating system 542. The gases then condensate on the cooled substrate 516 to form a layer, such as an organic film, for example an OPF.

In one embodiment, two or more solids in the ampules 550 are sublimated to two or more gases, and each gas is flowed to a corresponding delivery portion in the showerhead assembly 512. Each delivery portion of the showerhead assembly 512 is heated to maintain gas flowing therethrough in the gas phase. The delivery portions may be heated to different temperatures based on the type of material flowing therethrough, such that the first delivery portion 518 is maintained at a first temperature by the first heating assembly 525 and the second delivery portion 521 is maintained at a second temperature by second heating assembly 527. The gases condensate on the surface of the substrate 516, which is at a low temperature, such as from about −40 degrees Celsius to about 70 degrees Celsius, to form a layer on the substrate 516. The substrate 516 may be rotated by the substrate support 514. The rotation speed dictates the mixing ratio of the two materials in the layer. The rotation speed may be slow enough for a laminated film to form on the substrate 516. The rotation speed may range from about 0 RPM to about 200 RPM, such as from about 5 RPM to about 100 RPM, for example from about 10 RPM to about 70 RPM. In one embodiment, the layer is an organic layer.

The processing chamber 500 further includes a first pump 573, a second pump 581, a throttle valve 575, and a pressure valve 583 to control the pressure of the processing chamber 500. The first pump 573, the second pump 581, the throttle valve 575, and the pressure valve 583 are all fluidly coupled to the processing region 571. The first pump 573 the second pump 581, the throttle valve 575, and the pressure valve 583 are optionally connected to the material delivery system 520.

Figure 5B:
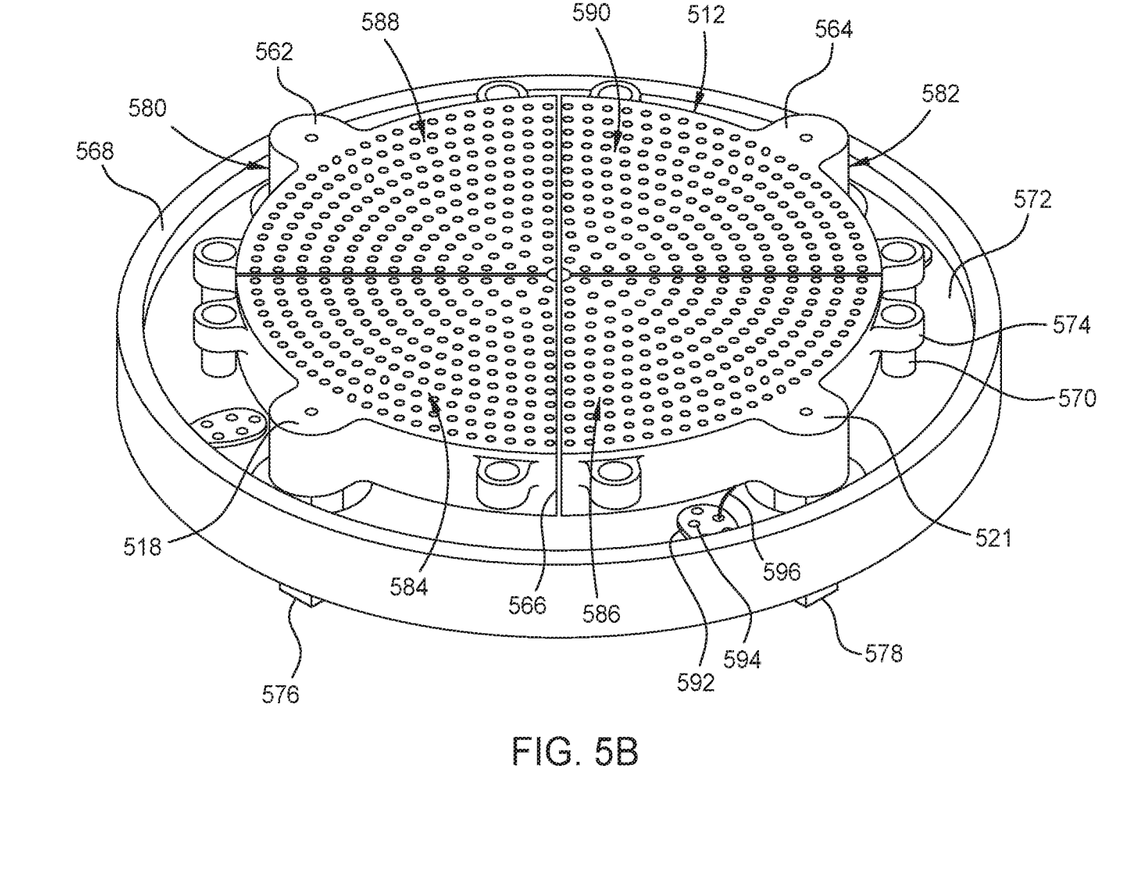
FIG. 5B is a bottom isometric view of a showerhead assembly of the processing chamber of FIG. 5A, according to one or more embodiments.

FIG. 5B is a bottom isometric view of the showerhead assembly 512 of the processing chamber 500, according to one or more embodiments. As shown in FIG. 5B, the showerhead assembly 512 includes a plurality of delivery portions, such as the first delivery portion 518, the second delivery portion 521, a third delivery portion 562, and a fourth delivery portion 564. The plurality of delivery portions 518, 521, 562, 564 may be coplanar and together may have a substantially circular shape. The plurality of delivery portions 518, 521, 562, 564 is arranged such that there is a gap 566 between adjacent delivery portions. The gap 566 advantageously reduces or prevents thermal cross-talk between adjacent delivery portions.

In some embodiments, the showerhead assembly 512 is capable of flowing two process gases therethrough without the two process gases being in contact within the showerhead assembly 512. For example, the first delivery portion 518 and the third delivery portion 562 are coupled to a first gas source, such as one ampule 550 (shown in FIG. 5A), and the second delivery portion 521 and the fourth delivery portion 564 are coupled to a second gas source, such as the other ampule 550 (shown in FIG. 5A). In some embodiments, the showerhead assembly 512 is capable of flowing three or four process gases therethrough and there are additional ampules 550 utilized to provide process gases.

The showerhead assembly 512 is mounted to a lid plate 568. The lid plate 568 has a plurality of mounts 570 extending from a bottom surface 572 of the lid plate 568. Each of the delivery portions 518, 521, 562, 564 of the showerhead assembly 512 includes one or more mounts 574 that are capable of mating with corresponding mounts 570 of the lid plate 568 to couple the showerhead assembly 512 to the lid plate 568. In the embodiment of FIG. 5B, the one or more mounts 574 extend from a radially outer surface of the showerhead assembly 512. In some embodiments, the mounts 570, 574 are made of an insulative (i.e., non-electrically conductive) material.

The first delivery portion 518 includes a first inlet 576 extending from the first delivery portion 518 and through an opening in the lid plate 568. Similarly, the second delivery portion 521, the third delivery portion 562, and the fourth delivery portion 564 include a second inlet 578, a third inlet 580, and a fourth inlet 582, extending from respective portion through openings in the lid plate 568. The first, second, third, and fourth inlets 576, 578, 580, and 582 are fluidly connected to the gas sources, such as the ampules 550. The first, second, third, and fourth inlets 576, 578, 580, 582 provide the process gasses to each of the first delivery portion 518, the second delivery portion 521, the third delivery portion 562, and the fourth delivery portion 564, respectively. The first delivery portion 518 includes a first plurality of openings 584 in fluid communication with the first inlet 576. The first plurality of openings 584 are configured to deliver a process gas into the processing chamber 500 and the processing region 571. Each of the delivery portions 521, 562, 564 includes a plurality of openings 586, 588, 590, respectively. The second plurality of openings 586 is in fluid communication with the second inlet 578, the third plurality of openings 588 is in fluid communication with the third inlet 580, and the fourth plurality of openings 590 is in fluid communication with the fourth inlet 582. The second, third, and fourth plurality of openings 586, 588, 590 are configured to deliver a process gas from each of the second, third, and fourth delivery portions 521, 562, 564 respectively into the processing chamber 500. The first, second, third, and fourth pluralities of openings 584, 586, 588, 590 may be arranged in any pattern suitable for uniformly depositing process materials onto the substrate 516 (shown in FIG. 5A).

The showerhead assembly 512 includes a plurality of feedthrough plates 592. The plurality of feedthrough plates 592 are configured to allow wires to pass from the showerhead assembly 512 through the lid plate 568. The wires can be heater wires, sensor wires, or the like. In some embodiments, the each of the plurality of feedthrough plates 592 includes a plurality of wire openings 594. In some embodiments, one or more heater wires 596 (one shown) are configured to pass through one of the feedthrough plates 592 and into the second delivery portion 521.

Figure 6:
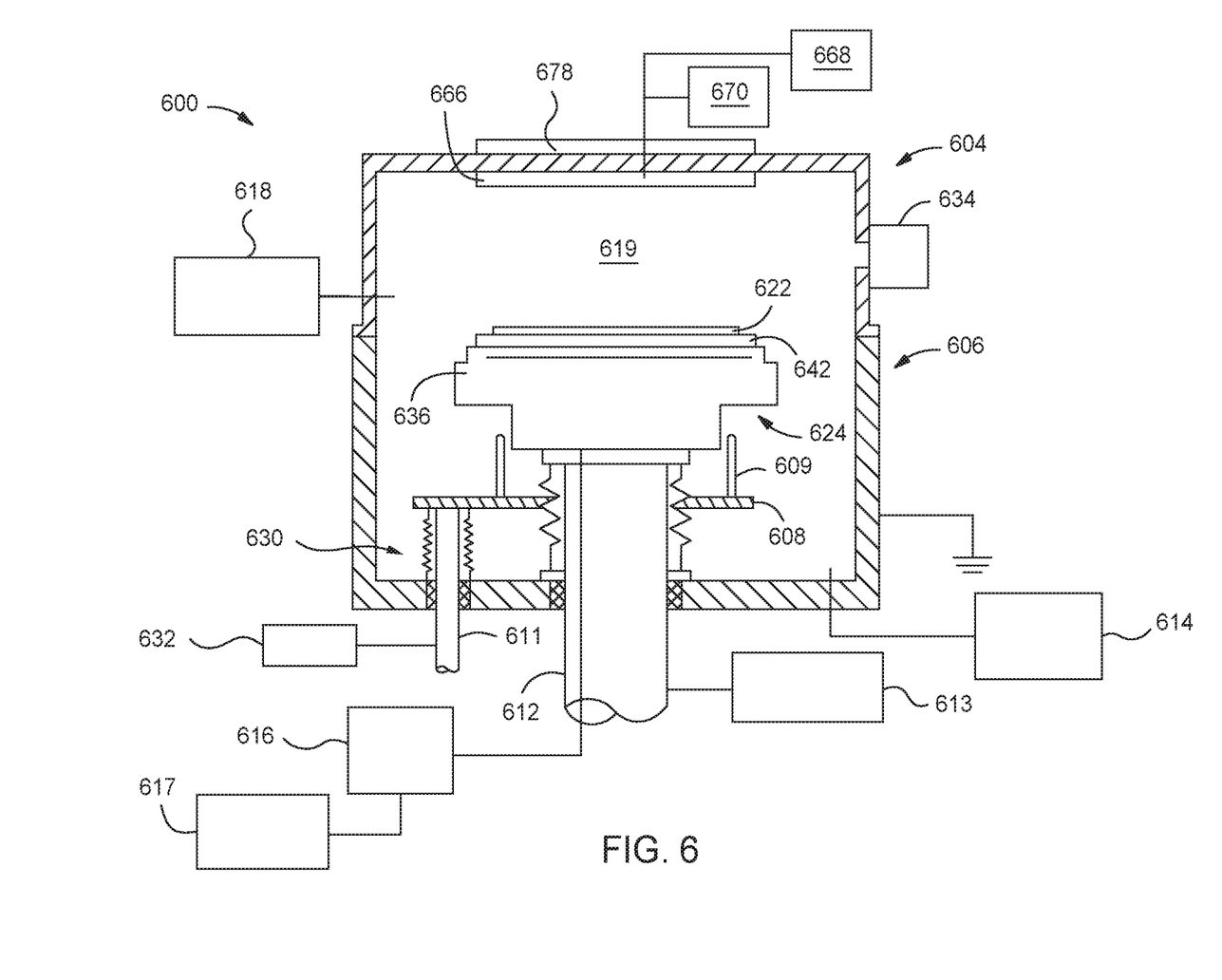
FIG. 6 is a schematic illustration of a processing chamber for depositing a layer, according to one or more embodiments.

FIG. 6 is a schematic illustration of a processing chamber 600 for depositing a layer, according to one or more embodiments. The processing chamber 600 may be similar to the processing chamber 138 shown in FIG. 1. The processing chamber 600 is a PVD chamber for depositing a metal oxide layer. The processing chamber 600 includes a chamber body 606 covered by a lid 604 which encloses a processing region 619. A slit valve 634 is coupled to an opening within the chamber body 606 and is configured to facilitate the transfer of a substrate 622 and a substrate carrier 642 into and out of the processing chamber 600. The chamber body 606 may be grounded to enable a plasma to be formed therein.

A substrate support 624 is disposed within the processing region 619 for supporting the substrate carrier 642 carrying the substrate 622. The substrate support 624 includes a pedestal 636 and a shaft 612 coupled to the pedestal 636. The shaft 612 may be coupled to a lift mechanism 613 that provides vertical movement of the substrate support 624. An RF power supply 617 and a RF match 616 are coupled to the pedestal 636 for providing a bias power to the substrate 622 and carrier 642.

The processing chamber 600 further includes a substrate lift system 630. The substrate lift system 630 includes a platform 608 coupled to a shaft 611, which can be lifted by a lift 632. Lift pins 609 are mounted on the platform 608, and the lift pins 609 are configured to go through through-holes (not shown) formed in the pedestal 636 to lift the substrate 622 and the substrate carrier 642. In some embodiments, the lift pins 609 are configured to lift only the substrate 622. The processing chamber 600 further includes a pumping system 614 to control the pressure within the processing chamber 600.

The processing chamber 600 further includes a target 666 disposed within the processing region 619. A power source 668 is coupled to the target 666 to apply a voltage to the target 666. In some embodiments, an RF power supply 670 may be coupled to the target 666 to apply RF power to the target 666 to facilitate control of the radial distribution of a deposition rate on the substrate 622. A magnetron assembly 678 may be disposed over the target 666 to assist in plasma processing within the processing chamber 600. A process gas supply 618 is coupled to the processing chamber 600 for providing one or more process gases to the processing region 619.

A processing system including a plurality of processing chambers is disclosed. In one embodiment, the processing system is utilized for form one or more organic films and a protective layer without exposing the deposited layers to ambient environment, which causes the organic films to deteriorate. The processing system includes at least an evaporation chamber for forming one or more organic films and a PVD or CVD chamber for forming the protective layer, such as a metal oxide layer. A carrier is utilized in the processing system to carry the substrate to various processing chambers. The carrier helps flatten the substrate, to support the heavy metal mask that is loaded on the substrate, and to allow substrates having various sizes to be processed in the processing chambers.

While the foregoing is directed to embodiments of the present disclosure, other and further embodiments of the disclosure may be devised without departing from the basic scope thereof, and the scope thereof is determined by the claims that follow.

What is claimed is:

1. A processing system, comprising:
 a first transfer chamber;
 a plurality of processing chambers coupled to the first transfer chamber; and
 a controller configured to cause a process to be performed in the processing system, the process comprising:
  aligning and placing a first mask on a substrate, the aligning and placing the first mask on the substrate comprising:
   placing the substrate on an alignment stage within a mask alignment chamber;
   positioning the first mask over the substrate on the alignment stage; and
   aligning the alignment stage and the substrate to the first mask positioned over the substrate by moving the alignment stage;
   wherein the alignment stage is movable in each of an X direction, a Y direction, a Z direction, and a θ direction to position and align the substrate with the first mask;
  removing the substrate and the first mask from the alignment stage after aligning the first mask;
  moving the substrate and the first mask from the mask alignment chamber to a processing chamber; and
  depositing a first layer on the substrate through the first mask within the processing chamber, the depositing the first layer comprising:
   sublimating a first solid to a first gas; and
   flowing the first gas through a showerhead assembly maintained at a first temperature.

2. The processing system of claim 1, wherein the first gas is flowed through a first delivery portion of the showerhead assembly, and the first delivery portion is maintained at the first temperature, wherein the depositing the first layer is by co-evaporation of the first solid and a second solid, the depositing the first layer further comprising:
 sublimating the second solid to a second gas; and
 flowing the second gas through a second delivery portion of the showerhead assembly, wherein the second delivery portion is maintained at a second temperature.

3. The processing system of claim 1, wherein the process further comprises performing a pre-clean process on a substrate and depositing one or more layers on the first layer, while at least one of the one or more layers is deposited by co-evaporation of multiple materials.

4. The processing system of claim 1, wherein the process further comprises depositing one or more layers on the first layer and at least one of the one or more layers is deposited through a second mask.

5. The processing system of claim 1, wherein the process further comprises depositing one or more layers on the first layer and the first layer comprises an organic layer.

6. The processing system of claim 5, wherein the process further comprises depositing a metal oxide layer on the one or more layers.

7. A processing system, comprising:
 a first transfer chamber;

a first processing chamber coupled to the first transfer chamber;
a second processing chamber coupled to the first transfer chamber;
one or more pass through chambers coupled to the first transfer chamber;
a second transfer chamber coupled to the one or more pass through chambers;
a third processing chamber coupled to the second transfer chamber;
a fourth processing chamber coupled to the second transfer chamber;
a fifth processing chamber coupled to the second transfer chamber; and
a controller configured to cause a process to be performed in the processing system, the process comprising:
positioning a first mask over a substrate in the third processing chamber, the substrate positioned on an alignment stage and the third processing chamber being a mask alignment chamber;
aligning the alignment stage and the substrate to the first mask positioned over the substrate by moving the alignment stage, wherein the alignment stage is movable in each of an X direction, a Y direction, a Z direction, and a θ direction;
removing the substrate and the first mask from the alignment stage after aligning the first mask;
moving the substrate and the first mask from the mask alignment chamber to the fourth processing chamber; and
depositing a first layer on the substrate through the first mask in the fourth processing chamber.

8. The processing system of claim 7, wherein the depositing the first layer comprises:
sublimating a first solid to a first gas;
sublimating a second solid to a second gas;
flowing the first gas through a first delivery portion of a showerhead assembly, the first delivery portion is maintained at a first temperature; and
flowing the second gas through a second delivery portion of the showerhead assembly, the second delivery portion is maintained at a second temperature.

9. The processing system of claim 8, wherein the first temperature is different from the second temperature.

10. The processing system of claim 7, wherein the process further comprises:
performing a degas process on the substrate in the first processing chamber;
performing a pre-clean process on the substrate in the second processing chamber; and
depositing a second layer in the fifth processing chamber, wherein the second layer is deposited through a second mask.

11. The processing system of claim 10, wherein the first layer comprises an organic layer.

12. The processing system of claim 11, wherein the second layer comprises a metal oxide layer.

13. A method, comprising:
placing a substrate on a substrate carrier;
aligning and placing a first mask on the substrate in a processing system, the aligning and placing the first mask on the substrate comprising:
placing the substrate carrier and substrate on an alignment stage within a mask alignment chamber;
positioning the first mask over the substrate on the alignment stage; and
aligning the alignment stage and the substrate to the first mask positioned over the substrate by moving the alignment stage;
wherein the alignment stage is movable in each of an X direction, a Y direction, a Z direction, and a θ direction to position and align the substrate with the first mask; and
removing the substrate and the first mask from the alignment stage after aligning the first mask;
moving the substrate and the first mask from the mask alignment chamber to a processing chamber; and
depositing a first layer on the substrate through the first mask in the processing chamber, the depositing the first layer comprising:
sublimating a first solid to a first gas; and
flowing the first gas through a showerhead assembly maintained at a first temperature.

14. The method of claim 13, wherein the first gas is flowed through a first delivery portion of the showerhead assembly, and the first delivery portion is maintained at the first temperature, wherein the depositing the first layer is by co-evaporation of the first solid and a second solid, the depositing the first layer further comprising:
sublimating the second solid to a second gas; and
flowing the second gas through a second delivery portion of the showerhead assembly, wherein the second delivery portion is maintained at a second temperature.

15. The method of claim 14, further comprising performing a pre-clean process on the substrate in the processing system and depositing one or more layers on the first layer, wherein at least one of the one or more layers is deposited through a second mask.

16. The method of claim 14, further comprising depositing one or more layers on the first layer, wherein the first layer comprises an organic layer.

17. The method of claim 16, further comprising depositing a metal oxide layer on the one or more layers.

18. A processing system, comprising:
a first transfer chamber;
a plurality of processing chambers coupled to the first transfer chamber; and
a controller configured to cause a process to be performed in the processing system, the process comprising:
aligning and placing a rounded first mask on a substrate, the aligning and placing the rounded first mask on the substrate comprising:
placing the substrate on an alignment stage within a first processing chamber of the plurality of processing chambers;
positioning the rounded first mask over the substrate on the alignment stage; and
aligning the alignment stage and the substrate to the rounded first mask positioned over the substrate by moving the alignment stage;
wherein the alignment stage is movable in each of an X direction, a Y direction, a Z direction, and a θ direction to position and align the substrate with the rounded first mask;
removing the substrate and the rounded first mask from the alignment stage after aligning the rounded first mask;
moving the substrate and the rounded first mask from the first processing chamber to a second processing chamber; and
depositing a first layer on the substrate through the rounded first mask within the second processing chamber, the depositing the first layer comprising:

sublimating a first solid to a first gas;
sublimating a second solid to a second gas;
flowing the first gas through a first delivery portion of a showerhead assembly, the first delivery portion maintained at a first temperature; and
flowing the second gas through a second delivery portion of the showerhead assembly, the second delivery portion maintained at a second temperature; and
depositing a second layer.

19. The processing system of claim 1, further comprising an alignment system, the alignment system comprising:
one or more cameras and configured to:
capture one or more images of the first mask, a carrier configured to support the substrate, the substrate, or a combination thereof;
provide the one or more captured images to the controller for analysis to determine a difference in alignment between the first mask and the substrate; and
determine, based on the difference in alignment, a distance in each of the X direction, the Y direction, the Z direction, and the θ direction to move the alignment stage to align the substrate with the first mask.

20. The processing system of claim 1, wherein the aligning and placing a first mask on the substrate is performed at a same pressure as the depositing a first layer on the substrate through the first mask.

21. The processing system of claim 1, wherein the mask alignment chamber comprising:
the alignment stage;
a first mask stocker;
a transfer robot configured to transfer a mask between the first mask stocker and the alignment stage; and
a valve assembly configured to isolate an interior volume of the mask alignment chamber from a transfer chamber while allowing a carrier and the substrate to be transferred into and out of the mask alignment chamber.

22. The processing system of claim 21, wherein the mask alignment chamber includes a second mask stocker.

* * * * *